United States Patent
Lindberg et al.

(10) Patent No.: US 10,546,044 B2
(45) Date of Patent: *Jan. 28, 2020

(54) LOW PRECISION CONVOLUTION OPERATIONS

(71) Applicant: Apple Inc., Cupertino, CA (US)

(72) Inventors: Lars M. Lindberg, Bjaerred (SE); Ali Sazegari, Cupertino, CA (US); Paul S. Chang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 5 days.

This patent is subject to a terminal disclaimer.

(21) Appl. No.: 16/035,516

(22) Filed: Jul. 13, 2018

(65) Prior Publication Data
US 2019/0354568 A1    Nov. 21, 2019

Related U.S. Application Data

(60) Provisional application No. 62/671,843, filed on May 15, 2018.

(51) Int. Cl.
| | | |
|---|---|---|
| *G06F 17/15* | (2006.01) | |
| *G06F 17/00* | (2019.01) | |
| *G06F 17/10* | (2006.01) | |
| *G06T 5/20* | (2006.01) | |

(Continued)

(52) U.S. Cl.
CPC .............. *G06F 17/153* (2013.01); *G06T 5/20* (2013.01); *H03H 17/028* (2013.01)

(58) Field of Classification Search
CPC combination set(s) only.
See application file for complete search history.

(56) References Cited

U.S. PATENT DOCUMENTS

| | | |
|---|---|---|
| 6,125,212 A | 9/2000 | Kresch et al. |
| 6,457,032 B1 * | 9/2002 | Silver .................... H03H 17/02 708/315 |
| 8,306,348 B2 | 9/2012 | Cohen et al. |

(Continued)

OTHER PUBLICATIONS

Goldberg, David "What Every Computer Scientist Should Know About Floating-Point Arithmetic" ACM Computing Surveys, vol. 23, No. 1, Mar. 1991 pp. 1-70.

(Continued)

*Primary Examiner* — Wesner Sajous
(74) *Attorney, Agent, or Firm* — Dickinson Wright RLLP

(57) ABSTRACT

This application relates to an optimization for a technique for filtering an input signal according to a convolution kernel that is stored in a floating point format. A method for filtering the input signal includes: receiving a set of filter coefficients that define the convolution kernel; determining an order for a plurality of floating point operations configured to generate an element of an output signal; and filtering the input signal by the convolution kernel to generate the output signal. Each floating point operation corresponds with a particular filter coefficient, and the order for the plurality of floating point operations is determined based on a magnitude of the particular filter coefficient associated with each floating point operation. The filtering is performed by executing the plurality of floating point operations according to the order. The data path can be a half-precision floating point data path implemented on a processor.

20 Claims, 11 Drawing Sheets

(51) Int. Cl.
*H03H 17/02* (2006.01)
*G06K 9/36* (2006.01)

(56) References Cited

U.S. PATENT DOCUMENTS

| | | | |
|---|---|---|---|
| 9,536,291 B2 | 1/2017 | Takagi | |
| 2006/0245660 A1* | 11/2006 | Hung | H04N 5/217 |
| | | | 382/254 |
| 2008/0250092 A1 | 10/2008 | Montvelishsky | |
| 2016/0295158 A1* | 10/2016 | Van Belle | G06T 3/4007 |
| 2017/0116495 A1* | 4/2017 | Nomura | G06K 9/46 |

OTHER PUBLICATIONS

Dr. Dobb's "Floating-point Summation" URL http://www.drdobbs.com/floating-point-summation/184403224, Sep. 1, 1996 pp. 1-6.
Stackoverflow.com Questions: "Minimize floating point error when adding multiple floating point variables" asked Oct. 2, 2013 pp. 1-3.

\* cited by examiner

LOW PRECISION CONVOLUTION OPERATIONS

CROSS-REFERENCE TO RELATED APPLICATIONS

The present application claims the benefit of U.S. Provisional Application No. 62/671,843, entitled "LOW PRECISION CONVOLUTION OPERATIONS," filed May 15, 2018, the content of which is incorporated herein by reference in its entirety for all purposes.

FIELD

The described embodiments relate generally to floating point operations. More particularly, the present embodiments relate to performing convolution operations using low-precision floating point values.

BACKGROUND

Processors are implemented to execute a number of instructions on one or more data paths. Different data paths are designed to implement different types of operations or similar operations on data in different formats. Typically, a single processor core can include an arithmetic logic unit, a floating point unit, and special function units such as a load/store unit. The arithmetic logic unit can be configured to perform operations such as addition, subtraction, multiplication, and division on integer operands, and the floating point unit can be configured to perform operations such as addition, subtraction, multiplication, and division on floating point operands.

Floating-point values are typically represented in software using the Institute of Electrical and Electronics Engineers (IEEE) 754-2008 single-precision, 32-bit format or the IEEE 754-2008 double-precision, 64-bit format. However, using a lower precision format—such as the IEEE 754-2008 half-precision, 16-bit format—can significantly speed up computations when the extra precision is not required. The increase in speed comes at a price, typically resulting in a less-accurate result with a larger numerical error. It is of interest to minimize the numerical error, thereby maximizing accuracy of the result within a particular format when performing floating point computations.

SUMMARY

This paper describes various embodiments that relate to performing low-precision convolution operations utilizing a floating point data path of a processor. A convolution kernel is defined as a set of filter coefficients that correspond to a plurality of taps of an input signal. A tap can refer to a sample of a delayed version of the input signal or, alternately, a particular element of the input signal having a plurality of discrete elements. The input signal can be filtered according to the convolution kernel to generate a filtered output signal.

In some embodiments, a method for filtering the input signal includes: receiving a set of filter coefficients that define the convolution kernel; determining an order for a plurality of floating point operations configured to generate an element of an output signal; and filtering the input signal by the convolution kernel to generate the output signal. Each floating point operation corresponds with a particular filter coefficient, and the order for the plurality of floating point operations is determined based on a magnitude of the particular filter coefficient associated with each floating point operation. The filtering is performed by executing the plurality of floating point operations according to the order. The data path can be a half-precision floating point data path implemented on a processor.

In some embodiments, the order for the plurality of floating point operations is determined by sorting the floating point operations according to an ascending order of the magnitude of the particular filter coefficient associated with each floating point operation. Floating point operations within a particular convolution operation are then executed according to an ascending order from the smallest filter coefficient value to the largest filter coefficient value.

In some embodiments, the processor is a central processing unit. In other embodiments, the processor is a graphics processing unit. In yet other embodiments, the technique can be executed, at least in part, on a central processing unit and, at least in part, on a graphics processing unit. In some embodiments, determining the order of the floating point operations is performed by a software driver for a peripheral component of a system-on-chip. The software driver can implement an application programming interface that can be called by an application in order to perform the filtering of the input signal.

In some embodiments, the processor is a system-on-chip that includes at least one central processing unit core and one or more graphics processing unit cores. Each graphics processing unit core can include at least one half-precision floating point data path. The software driver is configured to issue a fused multiply add (FMA) operations to be executed by the half-precision floating point data path according to the order of FMA operations determined by the software driver. In some embodiments, elements of the input signal are converted from a first data format to a half-precision floating point format. In some embodiments, a data format of elements of a filtered output signal are converted from a half-precision floating point format to a second data format such as a single-precision floating point format or a fixed point format.

In some embodiments, each floating point operation comprises an FMA operation that is performed by: multiplying an element of the input signal with the particular filter coefficient to produce a partial product, and adding the partial product to a value in an accumulation register maintained by a data path.

In some embodiments, the convolution kernel is one-dimensional. In other embodiments, the convolution kernel is two-dimensional. In such embodiments, the convolution kernel can be separable such that filtering the input signal is performed by: applying a first set of filter coefficients to rows of elements in the input signal in a first pass to generate an intermediate filtered signal, and applying a second set of filter coefficients to columns of elements in the intermediate filtered signal in a second pass to generate an output signal.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
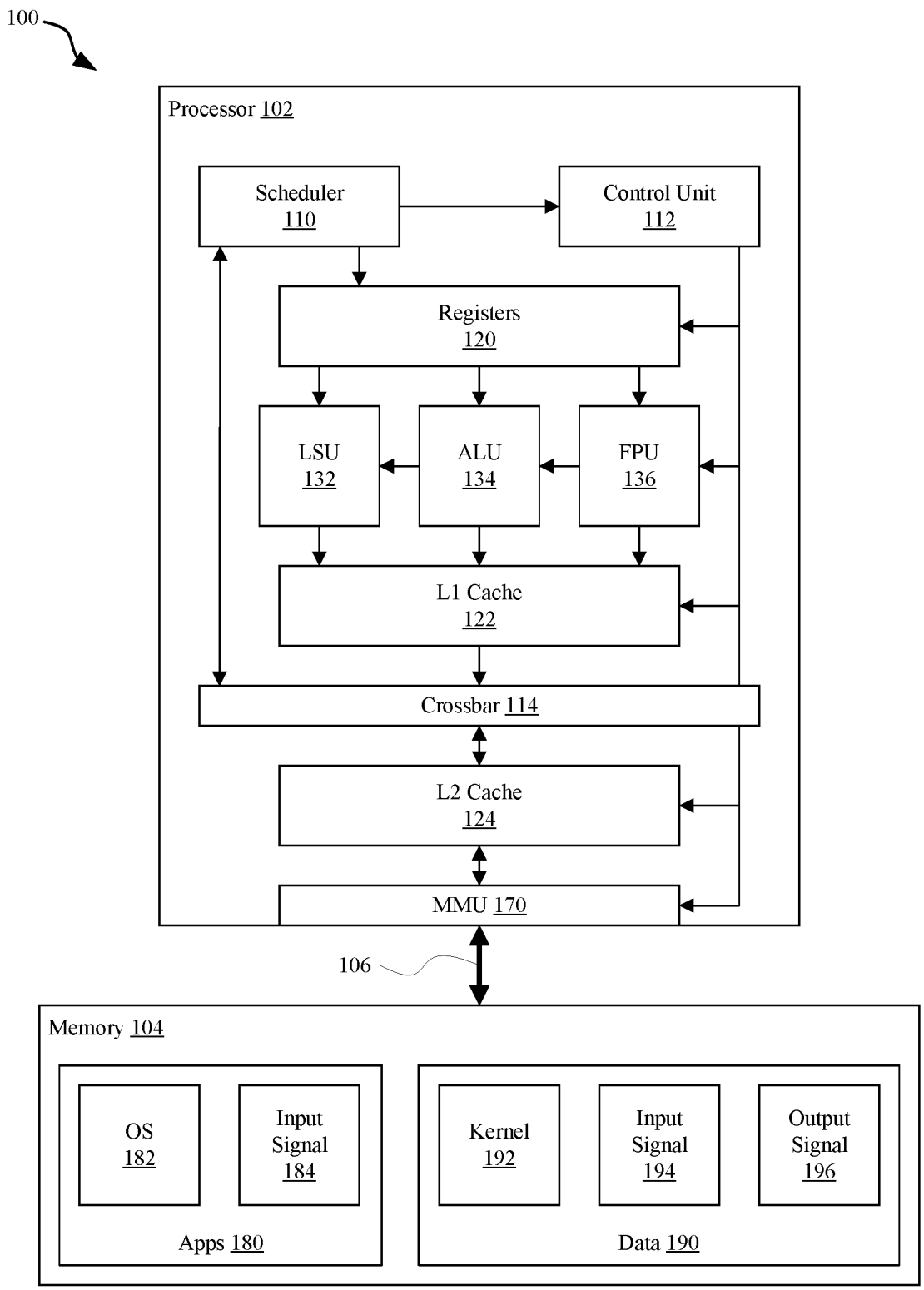
FIG. 1 illustrates a computing device configured to perform convolution operations, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

This description provides details related to computing convolution operations to minimize a numerical error in low-precision floating point formats, such as the IEEE 754-2008 half-precision floating point format. Computing a convolution operation includes applying, for each element of an output signal, a series of fused multiply add (FMA) operations. The technique for computing convolution operations set forth herein analyzes the filter coefficients defined for the convolution kernel and selects a specific convolution function that minimizes the statistical average error for that particular convolution kernel. More specifically, the selected convolution function arranges the set of operations for computing the convolution operation according to an increasing magnitude of the filter coefficients.

Filter coefficients in convolution kernels are often represented as floating point values, and a weighted average computation of a plurality of elements of an input signal is performed in floating point arithmetic, even though the elements of the input signal (e.g., pixel values) may be approximated by integers in a fixed point format. The computations are performed on central processing units (CPUs), graphics processing units (GPUs), or special-purpose hardware. The computations are also amenable to parallelization by vector processing units, parallel processors, and the like.

As an example of the technique, a simple one-dimensional convolution kernel is provided as:

$$\text{Kernel:}[1\ 4\ 6\ 4\ 1]\cdot\tfrac{1}{16} \qquad (\text{Eq. 1})$$

The convolution kernel is applied to an input signal x to compute a weighted average of five elements of the input signal x for each element of the output signal y. For example, an $i^{th}$ element of the output signal $y_i$ is equal to:

$$y_i = (x_{i-2} + 4x_{i-1} + 6x_i + 4x_{i+1} + x_{i+2}) * \tfrac{1}{16} \qquad (\text{Eq. 2})$$

Conventionally, this convolution operation would be performed as five FMA operations as:

TABLE 1

| | |
|---|---|
| $1^{st}$ FMA: | $y_i = 0.0625 * x_{i-2}$ |
| $2^{nd}$ FMA: | $y_i\mathrel{+}= 0.25 * x_{i-1}$ |
| $3^{rd}$ FMA: | $y_i\mathrel{+}= 0.375 * x_i$ |
| $4^{th}$ FMA: | $y_i\mathrel{+}= 0.25 * x_{i+1}$ |
| $5^{th}$ FMA: | $y_i\mathrel{+}= 0.0625 * x_{i+2}$ |

However, computing the $i^{th}$ element of the output signal $y_i$ using a different computation order of the FMA operations will result in a reduced numerical error, on average, over all elements of the output signal. For example, the convolution operation set forth above in Table 1 would be performed in this order instead:

TABLE 2

| | |
|---|---|
| $1^{st}$ FMA: | $y_i = 0.0625 * x_{i-2}$ |
| $2^{nd}$ FMA: | $y_i\mathrel{+}= 0.0625 * x_{i+2}$ |
| $3^{rd}$ FMA: | $y_i\mathrel{+}= 0.25 * x_{i-1}$ |
| $4^{th}$ FMA: | $y_i\mathrel{+}= 0.25 * x_{i+1}$ |
| $5^{th}$ FMA: | $y_i\mathrel{+}= 0.375 * x_i$ |

The general goal of re-ordering the FMA operations is to multiply the smallest filter coefficients with the corresponding elements of the input signal first and then accumulate the sum with the next smallest filter coefficients multiplied by corresponding elements of the input signal, continuing through all of the filter coefficients in the convolution kernel. Provided that the elements of the input signal are correlated, the convolution operation has a higher probability of adding a sequence of floating point values in ascending order. Such operation is more likely to produce results having a reduced numerical error compared to multiplying and summing according to the default order of filter coefficients, which is the conventional manner of performing convolution operations.

It will be appreciated that although the optimization set forth herein is described based on operations being performed using half-precision floating point format values, such operations can be utilized with higher-precision floating point formats as well in order to increase the overall accuracy of the results.

These and other embodiments are discussed below with reference to FIGS. 1-10; however, those skilled in the art will readily appreciate that the detailed description given herein with respect to these figures is for explanatory purposes only and should not be construed as limiting.

FIG. 1 illustrates a computing device 100 configured to perform convolution operations, in accordance with some embodiments. As shown in FIG. 1, the computing device 100 includes a processor 102 connected to a memory 104 via an interface 106. The computing device 100 can comprise separate components attached to a printed circuit board (PCB). Alternatively, the processor 102 and the memory 104 can be implemented on one or more integrated circuits included in a single package. The interface 106 can be a system bus, crossbar, or dedicated high speed memory interface, such as a synchronous DRAM interface. It will be appreciated that the computing device 100 can include other components in addition to the processor 102 and memory 104, such as a graphics processing unit (GPU), a network interface controller (NIC), input/output devices such as a display, keyboard, mouse, speakers, microphone, and the like.

The memory 104 includes applications 180 and data 190. The applications 180 comprise program instructions configured to be executed by the processor 102. As shown in FIG. 1, the applications 180 include an operating system 182 and one or more additional applications 184. The data 190 include a convolution kernel 192, an input signal 194, and an output signal 196.

The processor 102 includes a number of components that each represent a separate block of logic implemented in an integrated circuit. The components are connected within the integrated circuit by various interfaces implemented by one or more traces formed in the substrate of the integrated circuit. As shown in FIG. 1, the processor 102 can include, but is not limited to, an instruction fetch/decode unit 110, a control unit 112, a crossbar 114, registers 120, an arithmetic logic unit (ALU) 130, a floating point unit (FPU) 140, a cache unit 122, and a memory management unit (MMU) 170.

In some embodiments, the cache unit 122 is divided into a separate instruction cache and data cache. The instruction fetch/decode unit 110 requests instructions from programs being executed from the memory 104. The instruction fetch/decode unit 110 can include a program counter register that stores an address for the next instruction to be executed in the program. The instruction fetch/decode unit 110 requests the instruction from the memory by sending a request to the cache unit 122. If the instruction is located in the cache unit 122, then the cache unit 122 returns the instruction to the instruction fetch/decode unit 110 to be decoded and executed. However, if the instruction is not located in the cache unit 122, then the cache unit 122 transmits a request to the MMU 170 to fetch the instruction from a location in the memory 104 specified by the address in the program counter. The MMU 170 transmits a request to fetch a cache line associated with the address from the memory 104. The memory 104 returns the cache line to the MMU 170, which stores the cache line in the cache unit 122. In some embodiments, the instruction fetch/decode unit 110 can be configured to pre-load a number of instructions in the cache unit 122 prior to those instructions being ready to execute such that those instructions can be fetched into the cache unit 122 while other instructions are being executed by the processor 102.

Once an instruction is loaded into a register of the instruction fetch/decode unit 110, the instruction fetch/decode unit 110 decodes the instruction to determine an opcode and/or operands associated with the instruction. The opcode can determine the type of operation to be performed by the processor 102 in response to executing the instruction. The opcode can also determine whether the operation is going to be executed by the ALU 130 or the FPU 140 (or by any other units not explicitly shown in FIG. 1). The operands can specify specific registers in the registers 120 that are associated with the instruction. The instruction fetch/decode unit 110 configures the control unit 112 based on the opcode and operands decoded in the instruction. The control unit 112 then executes the operation specified by the opcode by controlling the various components of the processor 102, such as the registers 120, the ALU 130, the FPU 140, and the crossbar 114.

In some embodiments, a program can be defined in the memory 104 that includes a number of instructions configured to implement a convolution operation. A convolution operation, as referred to herein, is defined as applying a filter to an input signal 194 to generate an element of an output signal 196. The filter can be defined as a weighted sum of a number of taps of the input signal 194, where each tap is associated with a respective filter coefficient. The filter coefficients for all of the taps can be referred to as a convolution kernel. Convolution kernels can be one-dimensional or two-dimensional. Two-dimensional convolution filters are commonly used in image processing applications, e.g., when blurring or sharpening an image. In some cases, two-dimensional convolution filters are separable such that a one-dimensional filter can be applied to the rows of an input signal to produce a filtered intermediate signal, and then the same or a different one-dimensional filter can be applied to the columns of the filtered intermediate signal to produce a filtered output signal.

A convolution operation will typically be implemented as a number of FMA instructions executed by the FPU 140 that accumulate a partial product for each tap of the convolution kernel 192 into an accumulation register. A partial product can refer to an intermediate result of multiplying an element of the input signal 194 by a corresponding filter coefficient in the convolution kernel 192. Once all of the partial products for the convolution operation have been accumulated into the accumulation register, the value in the accumulation register is stored in the memory 104 as a corresponding element of the output signal 196. The convolution operation is then repeated for each element of the output signal 196, thereby applying the convolution kernel 192 to different portions of the input signal 194 to generate different elements of the output signal 196.

It will be appreciated that the particular implementation of a convolution operation can depend on the format of the operands. Filter coefficients are typically stored in floating point format, which is why the foregoing convolution operation was described as being executed on the FPU 140. In some cases, values of the input signal 194 can be stored in a different format, such as a signed or unsigned integer format, as can be the case when the input signal 194 is stored as a two-dimensional image comprising pixel data. For example, each pixel of the image can be stored as 32-bit RGBA values, and each component of the pixel color (e.g., red, green, blue, alpha) can be stored as an 8-bit unsigned integer between 0 and 255. In such cases, certain convolution operations can be optimized by, for example, summing a number of values from the input signal 194 associated with filter coefficients of the same value using the ALU 130 to generate an intermediate result for a particular filter coefficient value, and then converting the intermediate results to a floating point format before multiplying the converted intermediate result by the corresponding filter coefficient value in the FPU 140. In some cases, depending on the filter coefficients chosen for the filter kernel 192, the convolution operation can be executed faster because the ALU 130 and the FPU 140 can operate in parallel to perform independent calculations within the convolution operation.

It will be appreciated that the computing device 100 of FIG. 1 is merely shown for illustrative purposes and that the processor 102 can be implemented with a number of different processor architectures. For example, the processor 102 could be implemented with multiple processor cores that each include a separate and distinct ALU 130 and FPU 140. As another example, the processor 102 could include a hierarchical cache architecture including a level 1 (L1) cache dedicated to a particular core of multiple cores and a level 2 (L2) cache shared among a plurality of cores. In addition, the computing device 100 can include multiple processors 102 that operate in parallel. The multiple processors can be the same, such as where two or more similar processors share a workload, or different, such as where a main processor can offload a portion of the full workload to a co-processor (e.g., where a CPU and GPU operate in tandem).

Figure 2A:
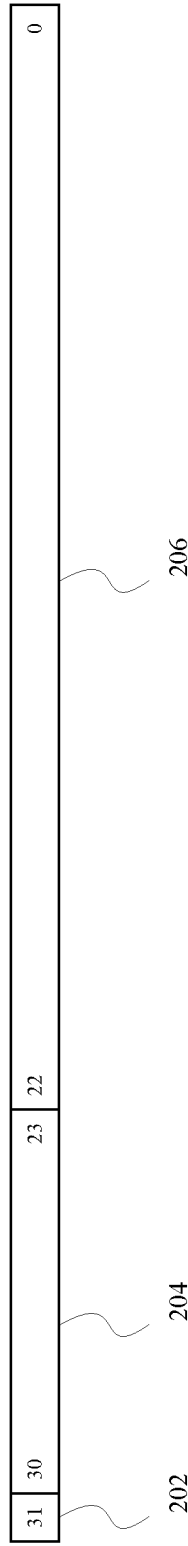
FIGS. 2A-2B illustrate common floating point formats, in accordance with some embodiments.
Figure 2B:
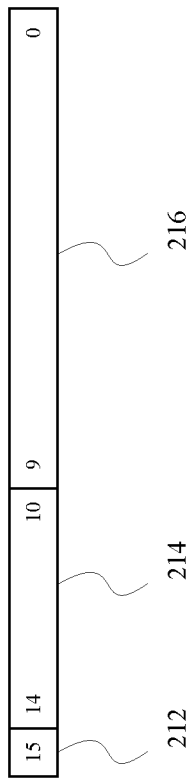

FIGS. 2A-2B illustrate common floating point formats, in accordance with some embodiments. As shown in FIG. 2A, the IEEE 754-2008 standard specifies a single-precision floating point format that is encoded as 32-bits (binary32). The single-precision floating point format includes one sign bit 202, eight exponent bits 204 and twenty-three significand bits 206. The significand provides twenty-four bits of precision due to an implied leading 1 to the left of a binary point and the twenty-three fraction bits of the significand to the right of the binary point.

As shown in FIG. 2B, the IEEE 754-2008 standard also specifies a half-precision floating point format that is encoded as 16-bits (binary16). The half-precision floating point format includes one sign bit 212, five exponent bits 214 and ten significand bits 216. The significand provides eleven bits of precision due to an implied leading 1 to the left of a binary point and the ten fraction bits of the significand to the right of the binary point.

It will be appreciated that other formats of floating point values are also specified by the IEEE 754-2008 standard including: double-precision floating point format (binary64) and quadruple-precision floating point format (binary 128), as well as 32-bit and 64-bit versions of decimal floating point formats.

It will also be appreciated that the precision of a floating point value is not only based on the number of bits of the significand, but of the value of the exponent as well. In other words, precision of a floating point value stored within a particular format—i.e., where the number of bits used to encode the exponent and significand portions of the value is constant—varies based on a magnitude of the floating point value. Stated another way, for a significand of m-bits in the fractional part of the significand (e.g., m=23 in single-precision and m=10 in half-precision) and an exponent value y, the precision of a floating point value can be defined as:

$$\text{precision} := \frac{2^y}{2^m} \quad \text{(Eq. 3)}$$

Therefore, when performing calculations with floating point numbers, there will be higher precision in the result when the calculations are being performed on operands having smaller magnitudes (e.g., smaller exponent values y) due to m being constant.

As an example, numerical error can be introduced when adding two operands, when one of the operands has an exponent value of 15 (e.g., the maximum exponent value). In such a case, the precision of a floating point value where y is equal to 15 is 32. In other words, one operand of the half-precision floating point value encodes a value between 32768 and 65504 in increments of 32. Attempting to add a second operand having a small value to this operand can be problematic when the second operand is less than 32 because the result can only be increased in increments of 32. Although this is an extreme example, the same principle applies when adding operands having disparate exponent values, although to a lesser extent.

Figure 3A:
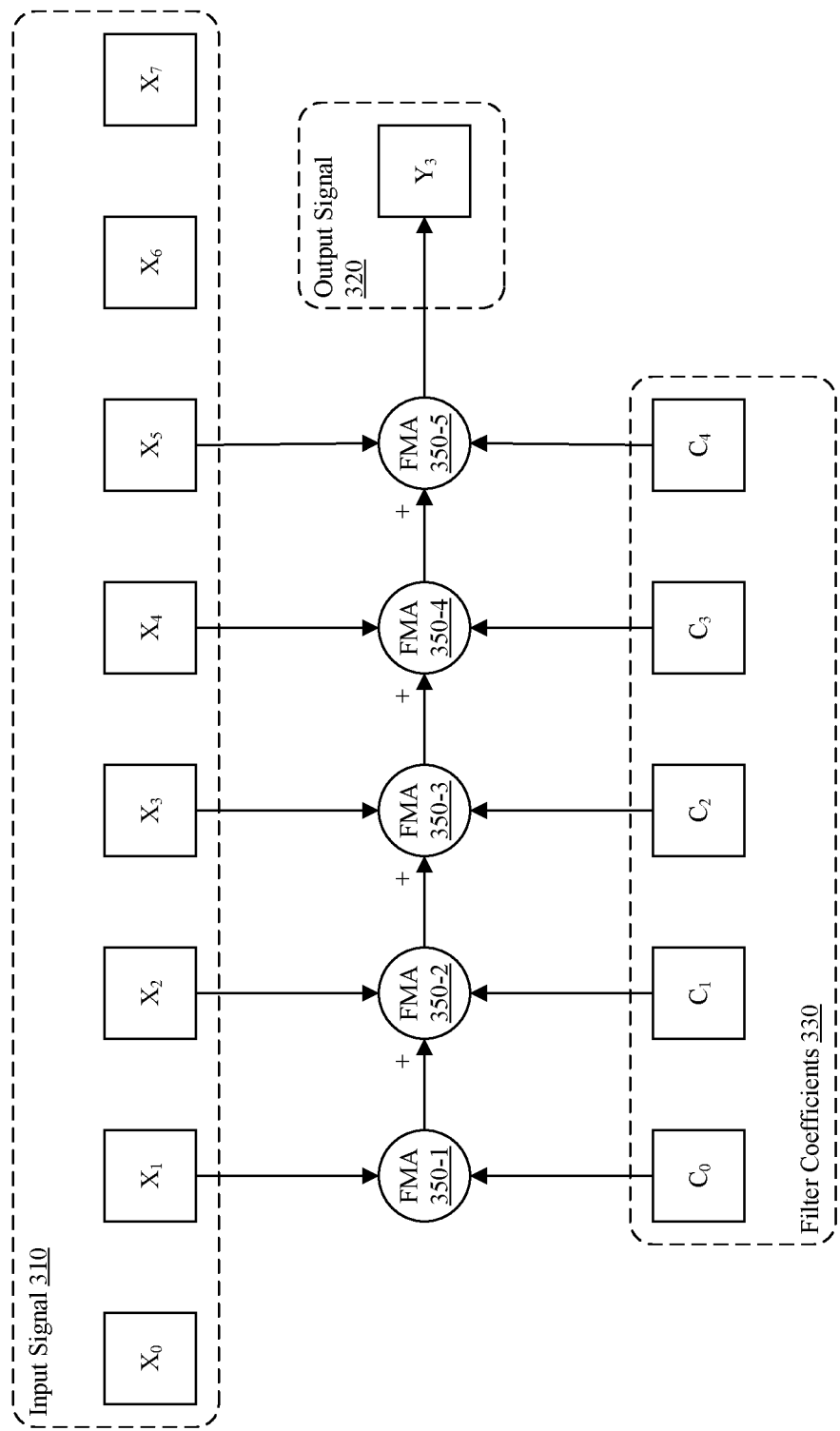
FIG. 3A illustrates a one-dimensional convolution operation, in accordance with some embodiments.

FIG. 3A illustrates a one-dimensional convolution operation, in accordance with some embodiments. As shown in FIG. 3A, an input signal 310 includes a number of elements $x_i$. The input signal 310 can represent samples of a continuous signal in a time-domain. In some embodiments, each element $x_i$ is a signed 32-bit integer. In other embodiments, each element $x_i$ is a single-precision floating point value. Of course, in some embodiments the elements can be converted from one format to another format, such as by converting signed integers to single-precision or half-precision floating point values.

In some embodiments, a one-dimensional convolution operation is implemented by calculating a value of an element of an output signal 320 for each element of the input signal 310. For example, as shown in FIG. 3A, the one-dimensional convolution operation includes five taps of the input signal 310 to generate each element of the output signal 320. A particular element $y_j$ of the output signal 320 is calculated by multiplying each of five elements ($x_{i-2}$, $x_{i-1}$, $x_i$, $x_{i+1}$, $x_{i+2}$) of the input signal 310 by corresponding coefficients $c_j$ of the filter coefficients 330.

For example, as shown in FIG. 3A, a fourth element $y_3$ of the output signal 320 can be calculated by executing a sequence of FMA operations 350 within the processor 102. A first FMA operation 350-1 multiplies element $x_i$ by filter coefficient $c_0$ and stores the result in an accumulation register. A second FMA operation 350-2 multiplies element $x_2$ by filter coefficient $c_1$ and adds the result to the value stored in the accumulation register. A third FMA operation 350-3 multiplies element $x_3$ by filter coefficient $c_2$ and adds the result to the value stored in the accumulation register. A fourth FMA operation 350-4 multiplies element $x_4$ by filter coefficient $c_3$ and adds the result to the value stored in the accumulation register. A fifth FMA operation 350-5 multiplies element $x_5$ by filter coefficient $c_4$ and adds the result to the value stored in the accumulation register. The value in the accumulation register is then written to a memory as the fourth element $y_3$ of the output signal 320.

The other elements of the output signal 320 can be calculated in similar ways by multiplying the coefficients of filter coefficients 330 by different subsets of the elements of the input signal 310. It will be appreciated that certain FMA operations can be omitted when there is no corresponding element of the input signal 310 for specific taps of the convolution filter (e.g., at the beginning or end of the input signal 310).

It will be appreciated that the accuracy of the result for a given element of the output signal 320 is based on the precision of each of the intermediate FMA operations 350 computed during the convolution operation. As multiple FMA operations are performed in sequence to accumulate the result into the accumulation register, further truncating of bits may occur when the magnitude of the value of the partial product and the magnitude of the value in the accumulation register diverge.

In some embodiments, the accuracy of the result can be optimized by performing the FMA operations 350 in a particular order. Ideally, the FMA operations 350 should be ordered based on an increasing magnitude of the partial products calculated by each FMA operation 350. However, in order to implement such an optimization, all of the partial products for the convolution operation would have to be calculated in a first pass to determine an order of the FMA operations for that particular element of the output signal 320 based on the magnitudes of the partial products. Once the order of the FMA operations has been determined, the FMA operations would need to be performed again, in order, during a second pass to accumulate the partial products from the ordered FMA operations into the accumulation register in order to maximize an accuracy of the result. Calculating the partial products twice would make this optimization inefficient in practice, by doubling the number of multiplication operations that need to be performed as well as introducing the need to determine the order of the FMA operations independently for each element of the output signal 320. This optimization also may be limiting where convolution operations need to be performed within specific time constraints, such as where real-time image processing is being performed.

It will be appreciated that the filter coefficients for each FMA operation are constant for all elements of the output signal 320. In other words, the same convolution kernel is applied to the input signal 310 when calculating all elements of the output signal 320. In some embodiments, an optimization of the convolution operation can be implemented that involves ordering the FMA operations based on the magnitudes of the filter coefficients under the assumption that, on average, the partial products associated with smaller filter coefficients are more likely to be smaller than partial products associated with larger filter coefficients. While this optimization does not maximize the accuracy of the result based on the magnitudes of the elements of the input signal 310, such an optimization can be implemented by comparing the magnitudes of the filter coefficients to determine the order of the FMA operations once, and then using the same order of the FMA operations to calculate all of the elements of the output signal 320. In this regard, the optimization will not adversely affect the execution time of the convolution operation when compared to executing the FMA operations in a default order independent of the magnitudes of the filter coefficients, assuming the latency for memory access requests is the same for both the default order and the optimized order of FMA operations.

It will also be appreciated that although the operations for performing the convolution operation are described herein as FMA operations, other types of instructions could be implemented in lieu of FMA instructions. For example, each FMA operation could alternately be implemented as a multiply instruction (MUL) followed by a separate addition instruction (ADD) where the FPU 140 does not implement a unified FMA operation. In yet other embodiments, the processor 102 could be implemented as a vector processor. In such embodiments, multiple operations can be performed in parallel on a plurality of vector units within the processor 102, where each operation performed by a vector unit corresponds to a particular element of the filter coefficients 330 and a particular element of the input signal 310.

Figure 3B:
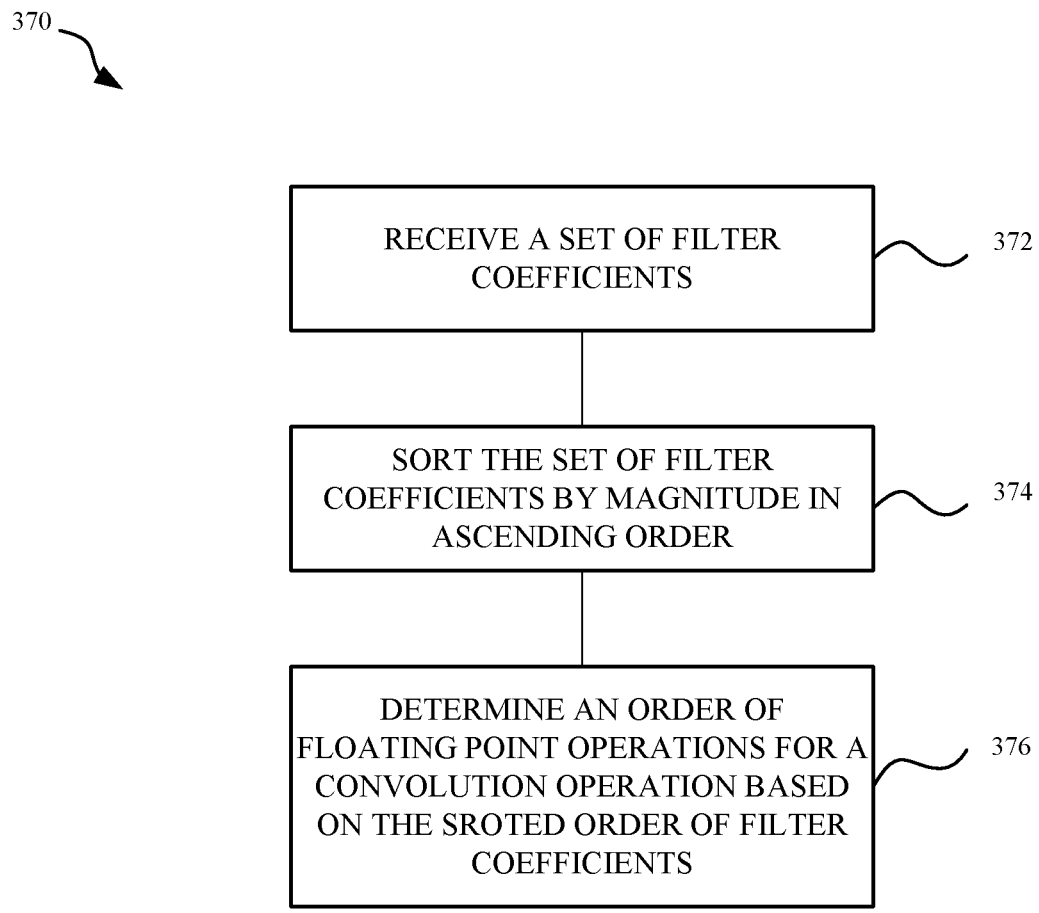
FIG. 3B is a flowchart of a method for optimizing a convolution operation, in accordance with some embodiments.

FIG. 3B illustrates a flowchart of a method 370 for optimizing a convolution operation, in accordance with some embodiments. The method 370 can be performed by software, hardware, or any combination of software or hardware. In some embodiments, the method 370 is implemented by a plurality of instructions executed by the processor 102 of computing device 100.

At 372, a set of filter coefficients associated with a convolution kernel are received. In some embodiments, the set of filter coefficients are provided in a half-precision floating point format. In other embodiments, the set of filter coefficients is provided in other formats, where each filter coefficient can be converted to a half-precision floating point format.

At 374, the set of filter coefficients are sorted by magnitude in an ascending order. In some embodiments, the filter coefficients are sorted in ascending order based on an absolute value of the magnitudes of the filter coefficients (e.g., ignoring the sign bit of the floating point values). The ascending order of the filter coefficients reflects an ascending order of the exponent values of the half-precision floating point format filter coefficients (e.g., from −14 to 15). When two filter coefficients have the same exponent value, they can also be sorted based on the significands of the filter coefficients.

At 376, an order for a plurality of floating point operations configured to perform a convolution operation is determined based on the sorted order of filter coefficients. Each floating point operation in the plurality of floating point operations corresponds with a particular filter coefficient in the set of filter coefficients of the convolution kernel. The order for the plurality of floating point operations is determined based on a magnitude of the particular filter coefficient associated with each floating point operation. In some embodiments, the floating point operations are FMA operations. In other embodiments, the floating point operations can be separate MUL operations and ADD operations. In yet other embodiments, the floating point operations can be vector operations.

Figures 4A, 4B:
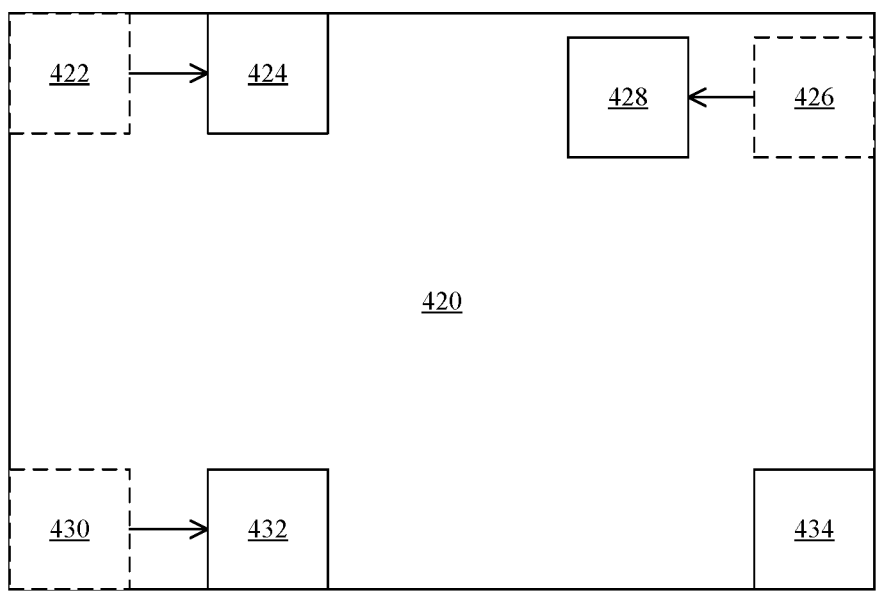
FIGS. 4A-4B illustrate a two-dimensional convolution operation, in accordance with some embodiments.

FIGS. 4A-4B illustrate a two-dimensional convolution operation, in accordance with some embodiments. Two-dimensional convolution operations are commonly utilized to filter image data, where a two-dimensional convolution kernel is applied to different windows of the image to calculate filtered pixel values of an output image.

A convolution kernel 410 can be defined as a two-dimensional array of filter coefficients $c_{i,j}$. As shown in FIG. 4A, the convolution kernel 410 is a 5×5 array of filter coefficients, which can be applied to a 5×5 pixel window of an image in order to generate a filtered pixel of an output image. As shown in FIG. 4B, a convolution operation is performed by applying the convolution kernel to a moving window across the image 420 to calculate the various filtered pixel values of the output image.

For example, the convolution kernel 410 is applied to a first window 422 of the image 420 to generate a first filtered pixel value of the output image. The window can then be shifted one pixel in a horizontal or vertical direction, where the convolution kernel 410 is then applied to a new window in the image 420 to generate a different filtered pixel value of the output image.

As shown in FIG. 4B, the filtering operation can proceed by shifting the convolution window 422 horizontally from left to right in the image 420, one pixel at a time, to new window 424. Once the shifted window reaches the right edge of the image 420, the convolution window is shifted vertically, one pixel at a time, to convolution window 426. The filtering operation can proceed by shifting the convolution window 426 horizontally from right to left in the image 420, one pixel at a time, to new window 428. Once the shifted window reaches the left side of the image 420, the convolution window is shifted vertically, one pixel at a time, and the filtering operation proceeds across the rows of pixels in the image until reaching the last row of the image at convolution window 430. The filtering operation proceeds by shifting the convolution window 430 horizontally from left to right in the image 420, one pixel at a time, to new window 432 until the convolution window 434 at the end of the image 420.

It will be appreciated that each convolution window is associated with a separate and distinct convolution operation that applies each of the filter coefficients in the convolution kernel 410 to a different pixel value in the convolution window. In this manner, each convolution operation is independent from other convolution operations and can be performed in parallel or out of order with respect to the serpentine order set forth above.

In some instances, a two-dimensional convolution filter can be separable into a one-dimensional convolution filter that is applied to the rows of the image and then, subsequently, to the columns of the filtered image. For example, a two-dimensional convolution kernel can be defined as:

$$\text{2-D Kernel:} \begin{bmatrix} 1 & 2 & 1 \\ 2 & 4 & 2 \\ 1 & 2 & 1 \end{bmatrix} \times \frac{1}{16} \quad \text{(Eq. 4)}$$

This two-dimensional kernel is separable into a one-dimensional convolution kernel defined as:

$$\text{1-D Kernel:} [1 \ 2 \ 1] \times \tfrac{1}{4} \quad \text{(Eq. 5)}$$

This one-dimensional kernel can be applied to the rows of the image in a first filtering operation to produce an intermediate filtered image. Then, the one-dimensional kernel can be applied to the columns of the image in a second filtering operation to produce the same final filtered image as if the two-dimensional kernel was applied to the image to each 3×3 pixel convolution window in a single filtering step. Separating a filtering operation for a two-dimensional kernel into two filtering operations of a one-dimensional kernel can potentially reduce the number of calculations performed during the aggregate filtering operation. In the above example, each filtered pixel of the output image would require the calculation of nine partial products in the two-dimensional kernel filtering operation, which is reduced to the calculation of six partial products when the two-dimensional kernel is separated into the three element one-dimensional kernel applied sequentially to the rows and columns of the image.

Figure 5:
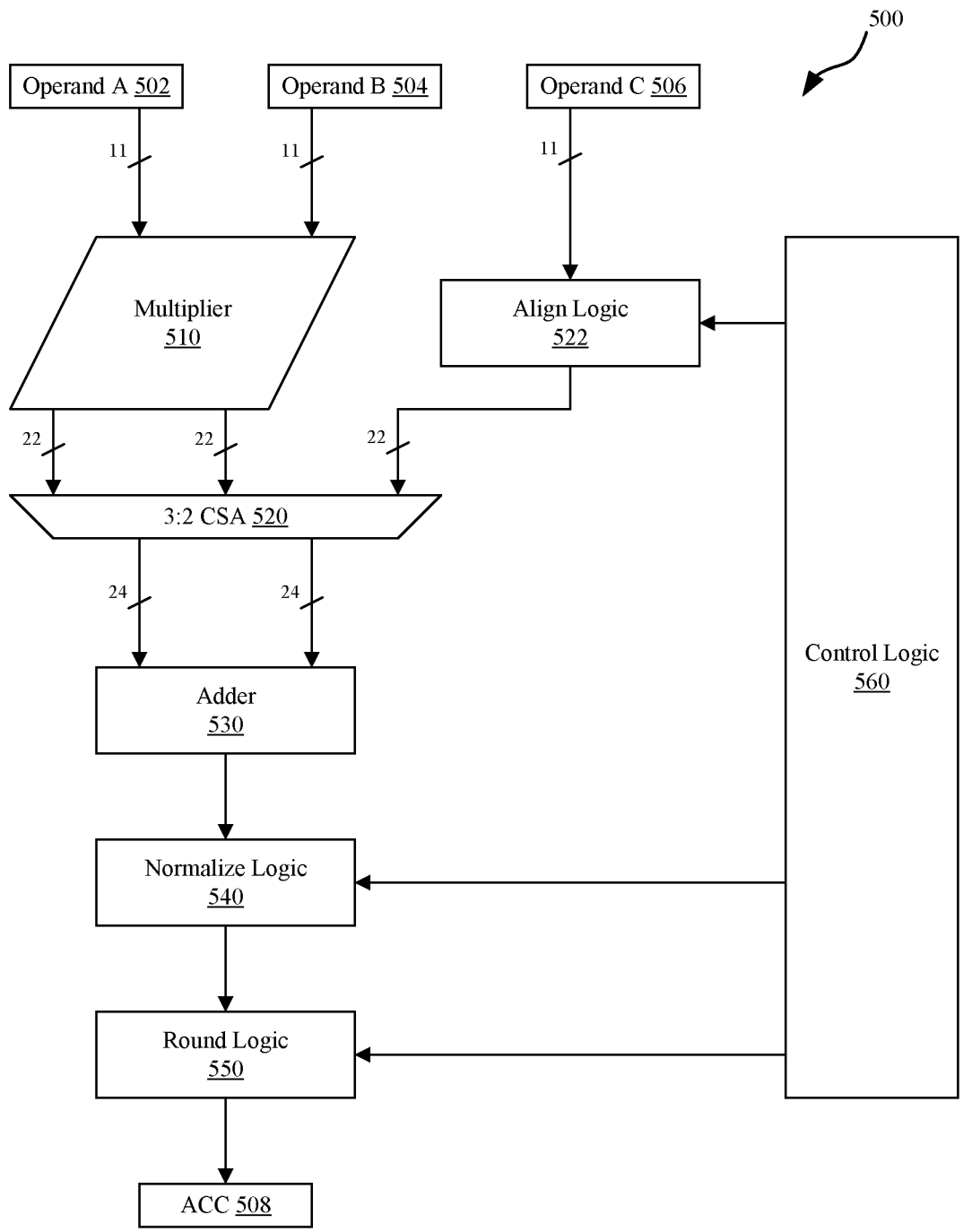
FIG. 5 illustrates a half-precision floating point data path, in accordance with some embodiments.

FIG. 5 illustrates a half-precision floating point data path 500, in accordance with some embodiments. FPU 140 may include one or more data paths to perform various floating point operations. For example, a FPU 140 can include a single-precision floating point data path configured to perform arithmetic operations on two or more 32-bit floating point operands. The FPU 140 can also include a single-precision floating point data path configured to multiply two 32-bit floating point operands and add the partial product of the multiplication operation to a third 32-bit floating point operand, which can be referred to as an FMA operation. In some embodiments, the FPU 140 may implement double-precision floating point data paths (e.g., 64-bit) instead of single-precision floating point data paths (e.g., 32-bit).

Recently, some processors have been implemented to include half-precision floating point data paths (e.g., 16-bit), typically because more than one half-precision floating point data path can be implemented in the same footprint on an integrated circuit die as a single-precision floating point data path due to, e.g., the number of transistors required to implement various components of the data path based on the reduced precision of 16-bit floating point operands.

As shown in FIG. 5, a half-precision floating point data path 500 includes registers to hold three 16-bit floating point operands: an Operand A register 502, an Operand B register 504, and an Operand C register 506. As discussed above, the 16-bit operands include one sign bit, five exponent bits, and ten significand bits. The half-precision floating point data path 500 is operable to multiply Operand A by Operand B and add the result of the multiplication to Operand C.

The half-precision floating point data path 500 includes a multiplier unit 510, align logic 522, a 3:2 carry sum adder (CSA) 520, a full adder 530, normalize logic 540, round logic 550, and control logic 560. The result of the operation is stored in an accumulation register 508. In some embodiments, the multiplier unit 510 is an 11×11 Wallace Tree. The multiplier unit 510 receives 11-bits of the significands (including the implied leading '1' bit to the left of the binary point) from the register 502 and the register 504. The multiplier unit 510 generates an output in a 22-bit sum and carry format. The sum and carry outputs of the multiplier unit 510 are then added to the 11-bits of the significand from the register 506.

It will be appreciated that, prior to being added to the output of the multiplier unit 510, the 11-bits of the significand of the Operand C 506 are aligned based on the exponents of the three operands. The exponent value of Operand A in the register 502 and the exponent value of the Operand B in the register 504 are added together to generate the exponent value of the result of the multiplication. In order to add significands for any two floating point values, the significands must first be aligned based on the exponent values such that the fractional components of the significand correspond to the same range of values. This can be performed by shifting the bits of the significand based on the difference in the exponent values. The align logic 522 compares the exponent value of Operand C in the register 506 to the exponent value of Operand A in the register 502 added to the exponent value of Operand B in the register 504, and then shifts the significand of Operand C in the register 506 by a number of bits based on the comparison. The shifted significand is output to 22-bits of precision to match the precision of the sum and carry values output by the multiplier unit 510.

The 3:2 CSA 520 adds the 22-bit sum output to the 22-bit carry output and the 22-bit shifted significand of Operand C. The 3:2 CSA 520 generates an output in a 24-bit sum and carry format. A full adder 530 then sums the 24-bit sum and carry outputs of the 3:2 CSA 520 to generate a 25-bit result.

The normalize logic 540 adjusts the exponent value of the result, which is calculated separately by adding the exponent bits of the Operand A in register 502 to the exponent bits of the Operand B in register 504. It will be appreciated that the significand portion of a floating point value falls within the range $1.0 \leq x < 2.0$ and, therefore, the result of an FMA operation A×B+C will fall in the range of $2.0 \leq x < 5.0$. Consequently, the top three bits of the result correspond to a value between 2 and 4 to the left of the binary point and a fractional portion of the result to the right of the binary point. The normalize logic 540 adjusts the exponent value corresponding to the significand portion of the result such that the result falls within the range of 1.0≤x<2.0. The normalize logic 540 also adjusts the exponent value corresponding to the significand portion of the result to reduce leading zeros in the significand portion of the result to reduce an error introduced by the rounding logic 550, which truncates the significand portion of the result to fit within the precision of a half-precision floating point value.

The control logic 560 controls the operation of the various units of the half-precision floating point data path 500. It will be appreciated that each unit shown in FIG. 5 may require an intermediate result produced by a unit coupled to that unit. For example, the 3:2 CSA 520 cannot perform an addition until the multiplier unit 510 has produced an output. Consequently, the control logic 560 controls the units such as by enabling the various units when the inputs to the units are ready to be consumed.

In some embodiments, the accumulation register 508 and the register 506 are the same register, such that the result of a first FMA operation is fed back into a subsequent FMA operation as the Operand C to be added to the result of a multiplication of a new Operand A in register 502 and a new Operand B in register 504. In other embodiments, the accumulation register 508 and the register 506 are separate registers, and the value stored in the accumulation register 508 is copied to the Operand C register 506 during a subsequent FMA operation in order to accumulate the result in the accumulation register 508.

It will be appreciated that the FMA operation as performed by the half-precision floating point data path 500 can be utilized to perform a convolution operation, where each FMA operation executed by the half-precision floating point data path 500 is operable to multiply one element of the input signal 310 by a corresponding element of the filter coefficient 330 or, in the case of a two-dimensional convolution filter, multiply one element of the image 420 by a corresponding element of the convolution kernel 410.

In some embodiments, the FPU 140 of the processor 102 includes at least one single-precision floating point data path and at least one half-precision floating point data path, such as the half-precision floating point data path 500. An application, such as application 184 or operating system 182, can include instructions configured to perform a convolution operation by issuing an ordered set of FMA operations to the half-precision floating point data path 500.

Figure 6:
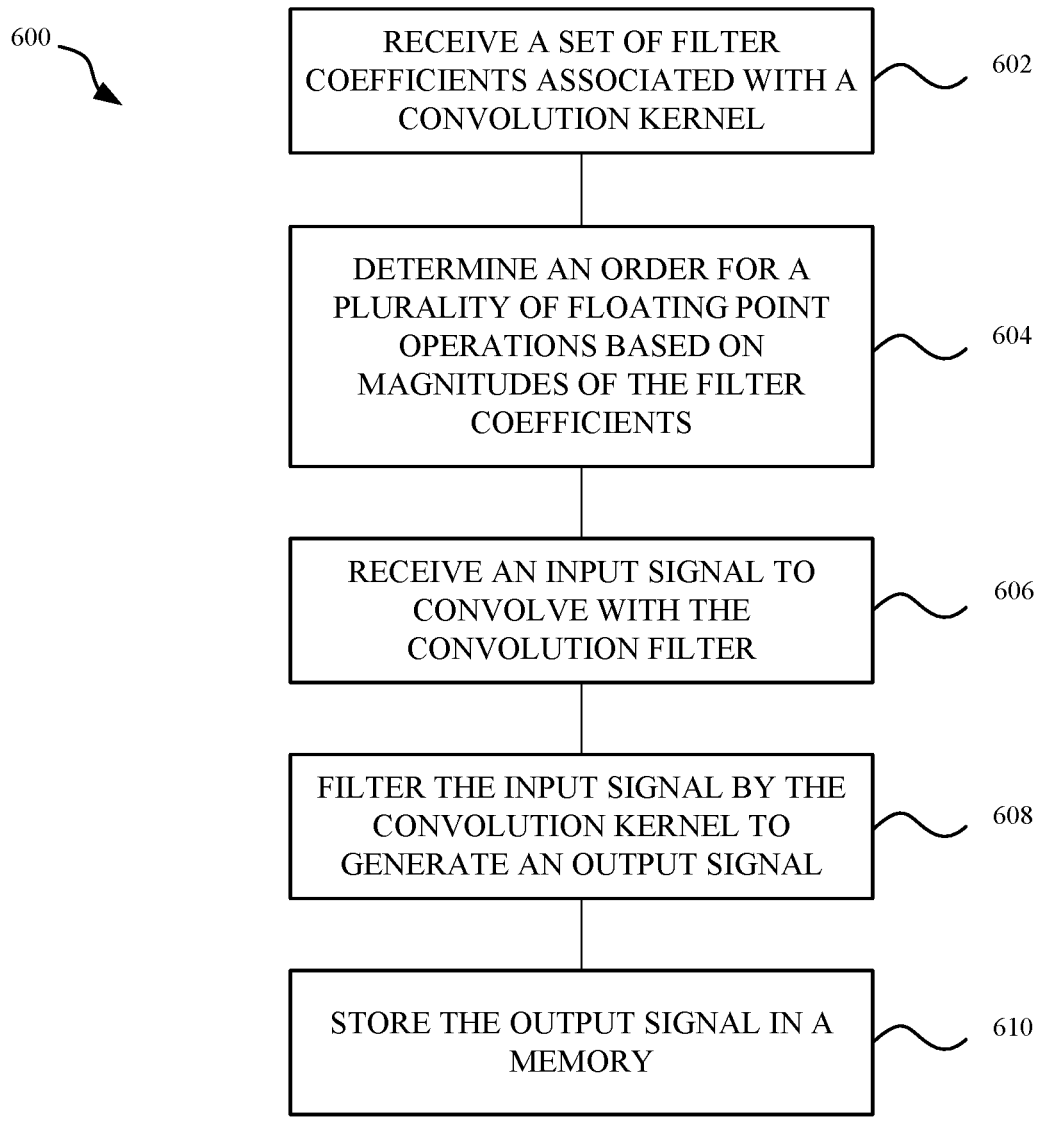
FIG. 6 is a flowchart of a method for filtering an input signal according to a convolution filter, in accordance with some embodiments.

FIG. 6 is a flowchart of a method 600 for filtering an input signal according to a convolution filter, in accordance with some embodiments. The method 600 can be performed by software, hardware, or any combination of software or hardware. In some embodiments, the method 600 is implemented by a plurality of instructions executed by a FPU 140 of the processor 102 of computing device 100. The FPU 140 can include a half-precision floating point data path 500 configured to execute FMA operations on three half-precision floating point operands.

At 602, a set of filter coefficients associated with a convolution kernel are received. In some embodiments, the set of filter coefficients are read from a memory accessible from a processor. The set of filter coefficients can comprise half-precision floating point format values. Alternatively, the set of filter coefficients can be converted to half-precision floating point format values.

At 604, an order for a plurality of floating point operations is determined based on the magnitudes of the filter coefficients included in the convolution kernel. The order of operations corresponds is determined by sorting the floating point operations according to an ascending order of the magnitude of the particular filter coefficient associated with each floating point operation.

At 606, an input signal is received. In some embodiments, the elements of the input signal are read from a memory accessible from a processor. In some embodiments, the input signal can be a one-dimensional array of discrete values that represent samples of a time varying signal. In other embodiments, the input signal can be a two-dimensional array of discrete values that represent, e.g., an image or other data arranged in rows and columns. In yet other embodiments, the input signal is n-dimensional where n is larger than two. For example, the input signal could be a volumetric image comprising a plurality of voxels in a three-dimensional space. In such instances, a convolution kernel could include filter coefficients associated with three indices (e.g., i, j, k). Additional dimensions are also possible, such as having an input signal of a volumetric image that varies over time.

At 608, the input signal is filtered by the convolution kernel to generate an output signal. In some embodiments, each element of the output signal is generated by executing the plurality of floating point operations according to the order. In some embodiments, the plurality of floating point operations include a set of FMA operations executed in an order according to an increasing magnitude of the corresponding filter coefficients.

At 610, the output signal is stored in a memory. Each of the elements of the output signal generated by executing the set of floating point operations is written to a location in a memory accessible by the processor.

Figure 7:
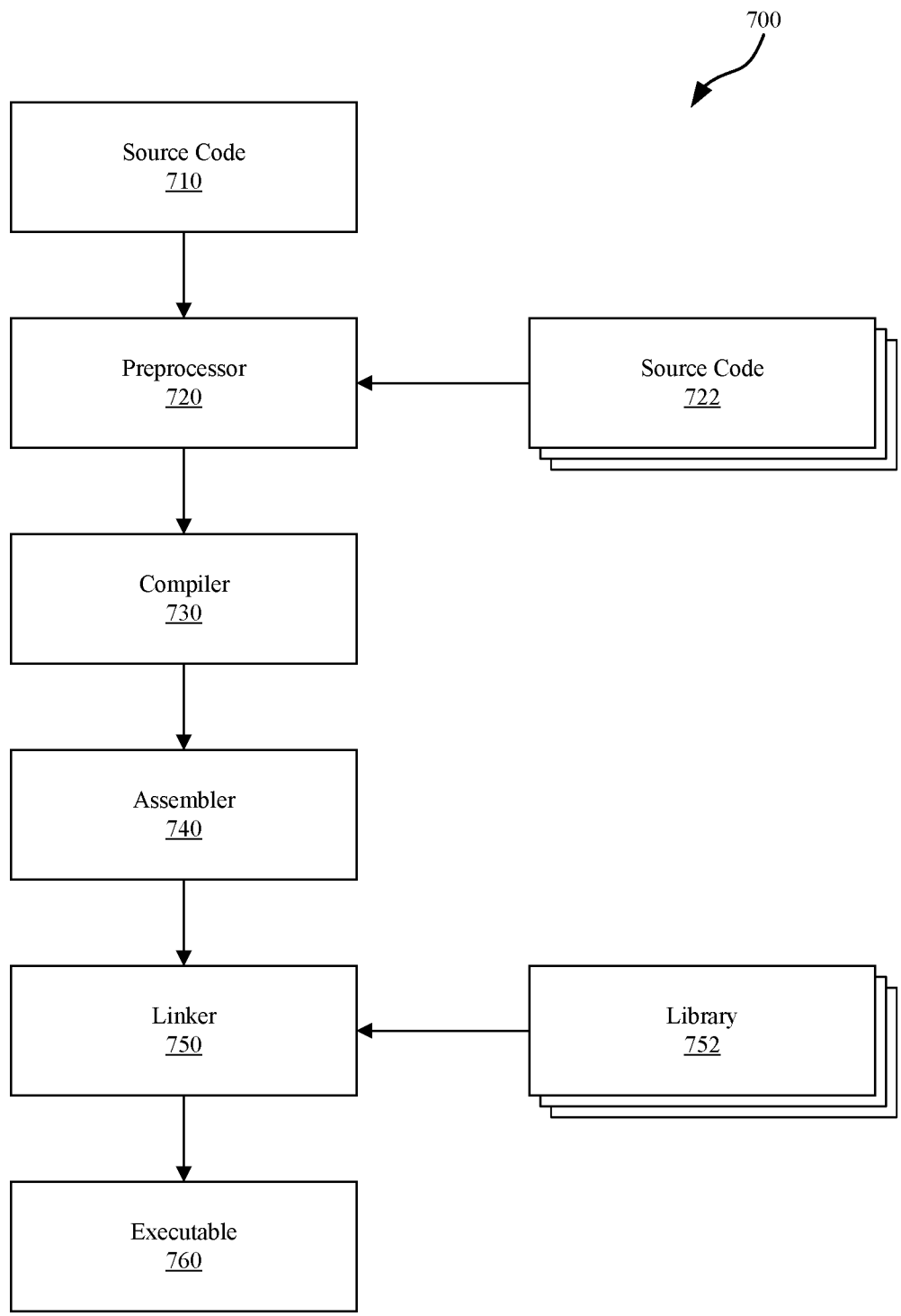
FIG. 7 illustrates a workflow for compiling source code into an executable program, in accordance with some embodiments.

FIG. 7 illustrates a workflow 700 for compiling source code into an executable program, in accordance with some embodiments. As shown in FIG. 7, a software developer generates source code 710 for an application. The source code 710 can be written in a variety of programming languages. The first step in compiling the source code 710 is performed by a program called a preprocessor 720. The preprocessor 720 parses the source code 710 and expands preprocessor directives such as macros, conditional compiler statements, and include statements. In some cases, the preprocessor 720 can replace a preprocessor directive included in the source code 710 with additional source code 722 in one or more separate files.

The pre-processed source code is then processed by the compiler 730, which converts the source code from a high-level language to an assembly language. The converted source code is then processed by the assembler 740, which converts the source code from the assembly language to machine code, which can be referred to as an object file. Finally, the object file is processed by the linker 750, which links the object file with libraries 752 (e.g., additional pre-compiled object files) to produce an executable program 760.

It will be appreciated that the techniques described above for performing a convolution operation can be implemented in multiple ways. For example, referring to various parts of FIG. 7, the source code 710 can include high-level program code that, when compiled into the executable program 760 and executed by the processor 102, causes the processor 102 to receive a set of filter coefficients, determine an order of a plurality of floating point operations based on magnitudes of the filter coefficients, and filter an input signal by the convolution kernel according to the order of the set of floating point operations.

In some embodiments, the high-level program code can be generated by a first software developer and provided to a second software developer as a software framework within one or more of the additional source code 722 files. The second software developer can then utilize the functions included in the software framework to include similar functionality related to performing convolution operations as described in more detail above. For example, the software framework could provide constructors and methods for implementing a convolution filter object. The constructors can include arguments to specify the set of filter coefficients in a convolution kernel for the convolution filter object. The convolution filter object can include private methods for analyzing the set of filter coefficients to determine an order of FMA operations for performing a convolution operation. The convolution filter object can also include public methods for applying the convolution filter object to an input signal to filter the input signal and generate an output signal. This software framework enables the second software developer to quickly implement a particular convolution kernel in their source code and filter input signals using the optimized technique described above to reduce the numerical error of the result.

In yet other embodiments, a software developer can develop libraries 752 that are compiled into object code and linked with the object code generated by the assembler 740 during compilation of the executable program 760. The software developer can specify an application programming interface (API) that is utilized within the source code 710 to call functions implemented by the libraries 752. For example, a library could be specified that takes a set of filter coefficients as input and generates a convolution filter object that can be utilized to filter an input signal by the convolution filter defined by the set of filter coefficients, where applying the filter is performed by executing a set of floating point operations according to an order based on the magnitudes of the filter coefficients. Such embodiments are different from the software framework described above in that the libraries are compiled into binary object files and source code for the functions in the libraries are typically not provided to the software developer to modify or extend.

In still other embodiments, such functionality can be built-in to an operating system that provides an execution environment for the executable program 760. For example, applying a convolution filter to an input signal can be a standard operation made available to executable program 760 by the operating system by way of a system call.

Figure 8:
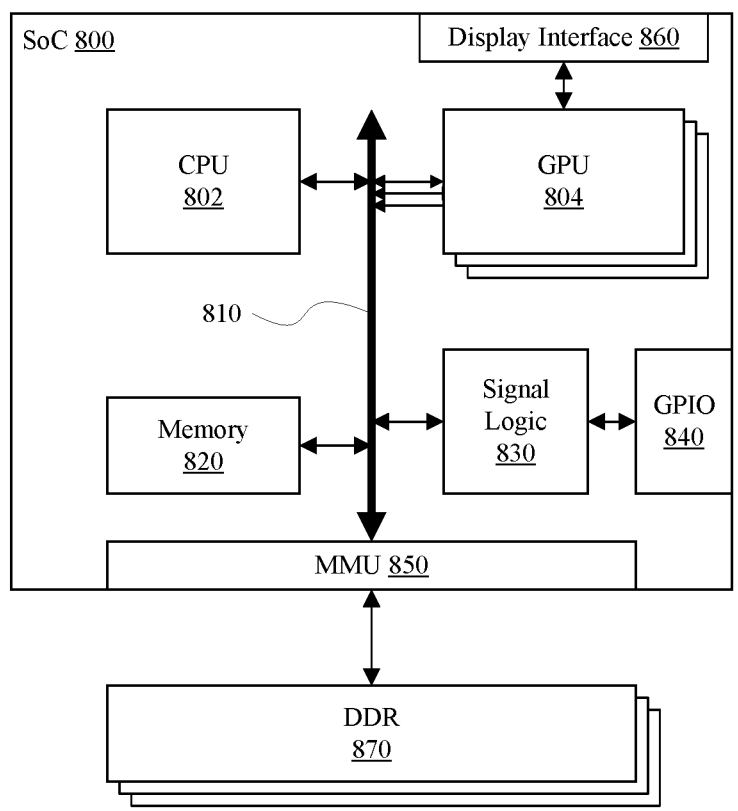
FIG. 8 illustrates a system-on-chip (SoC) that can be configured to filter an input signal according to a convolution kernel, in accordance with some embodiments.

FIG. 8 illustrates a system-on-chip (SoC) 800 that can be configured to filter an input signal according to a convolution kernel, in accordance with some embodiments. The SoC 800 is an integrated circuit formed on a silicon substrate. Different components are implemented as various logic within the integrated circuit. As shown in FIG. 8, the SoC 800 includes a CPU core 802, one or more GPU cores 804, a memory 820, signal logic 830, a general purpose input/output (GPIO) interface 840, and a memory management unit (MMU) 850. A system bus 810 connects the CPU core 802, the GPU core(s) 804, the memory 820, and the signal logic 830 to the MMU 850, enabling each of these components to access external memory 870, such as a dynamic random access memory (DRAM).

The GPU core(s) 804 are connected to a display interface 860. The display interface 860 generates video signals that can be connected to a display (not explicitly shown). Examples of a display interface include, but are not limited to, a DisplayPort interface, a High-Definition Multimedia Interface (HDMI) interface, a Thunderbolt interface, and the like.

The general purpose input/output (GPIO) interface 840 comprises signal interfaces for sampling digital or analog signals connected to the SoC 800. The GPIO interface 840 can include circuit protection components, signal conditioning components, pull-up circuits, pull-down circuits, comparators, and the like. The GPIO interface 840 can include both input signals and output signals. Output signals can generate a digital or analog signal at a corresponding pad of the SoC 800. Input signals can be passed to the signal logic 830 as analog signals, digital samples of an analog signal, or a binary logic level. The signal logic 830 can include one or more of an analog domain and a digital domain to perform various hardware based signal processing.

Figure 9:
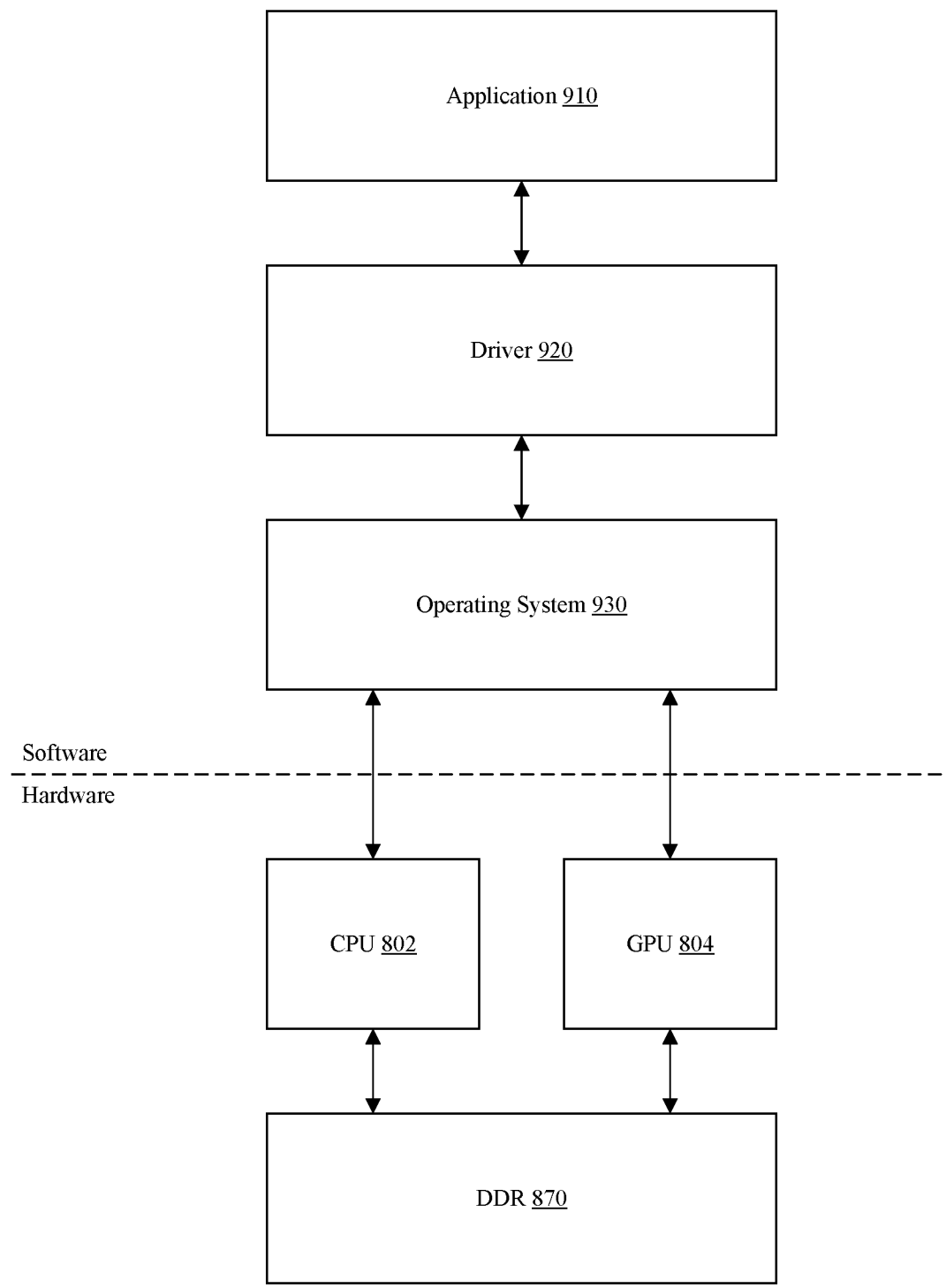
FIG. 9 illustrates a technique for filtering an input signal according to a convolution filter utilizing a peripheral component of the SoC, in accordance with some embodiments.

FIG. 9 illustrates a technique for filtering an input signal according to a convolution filter utilizing a peripheral component of the SoC 800, in accordance with some embodiments. An application 910, a software driver 920, and an operating system 930 are executed by a CPU core 802 of the SoC 800. The operating system 930 creates an operating environment for the application 910, which is configured to filter an input signal according to a convolution kernel utilizing a peripheral component such as one or more GPU core(s) 804. A software driver 920 for the peripheral can be installed with the operating system 930 in order to provide an API for the application 910 to be able to utilize the peripheral. The driver 920 generates system calls through the operating system 930 to interface with a peripheral such as the GPU core(s) 804.

In some embodiments, an application executed on the CPU core 802 can utilize the GPU core(s) 804 to apply a convolution kernel to an input signal. The input signal is stored in the memory 870 as well as the filter coefficients for the convolution kernel. The application 910 executed on the CPU core 802 can be configured to determine an order for floating point operations associated with a convolution kernel based on the magnitudes of the filter coefficients. The application then utilizes an API implemented by a software driver 920 for the GPU core(s) 804 to apply the convolution kernel to the input signal utilizing at least one GPU core 804 to execute the set of floating point operations according to the order determined by the application 910 executed on the CPU core 802.

In some embodiments, the software driver 920 for the GPU core(s) 804, rather than the application 910, is configured to determine the order of the floating point operations based on the filter coefficients defined for the convolution kernel. The software driver 920 then issues instructions to at least one GPU core 804 to implement the convolution operation on a half-precision floating point data path 500 within the at least one GPU core 804. In such embodiments, the application 910 executed by the CPU core 802 simply defines a convolution kernel and then filters one or more input signals according to the convolution kernel using an API implemented by the software driver 920. The software driver 920 handles all optimizations based on the ordering of the floating point operations.

Figure 10:
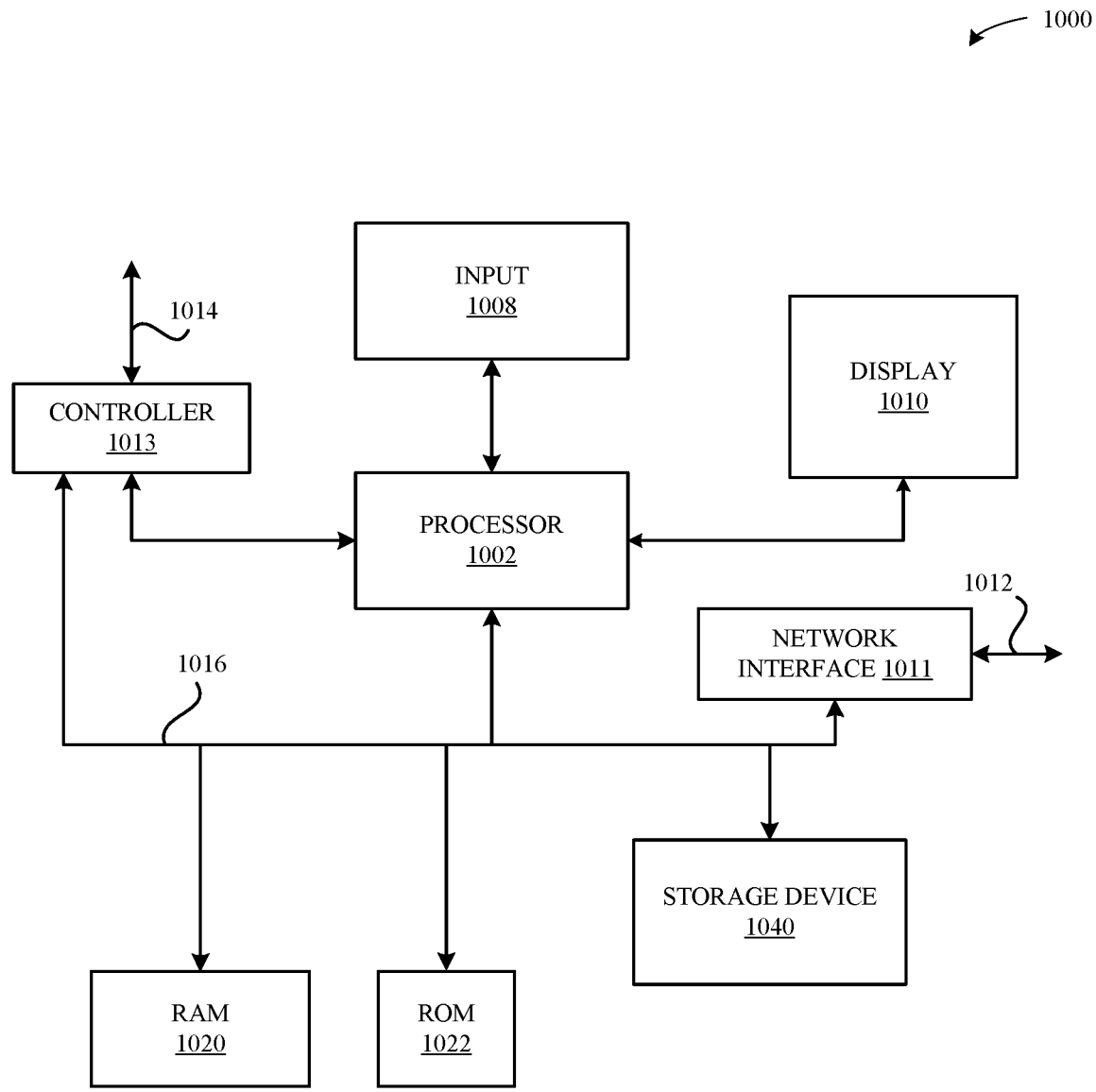
FIG. 10 illustrates a detailed view of an exemplary computing device that can be used to implement the various apparatus and/or methods described herein, in accordance with some embodiments.

FIG. 10 illustrates a detailed view of an exemplary computing device 1000 that can be used to implement the various apparatus and/or methods described herein, in accordance with some embodiments. In particular, the detailed view illustrates various components that can be included in the computing devices described herein. For example, the computing device 100, or any other device including any network device, computing device, and/or server computing device described herein, can include the components of computing device 1000.

As shown in FIG. 10, the computing device 1000 includes a processor 1002 that represents a microprocessor or controller for controlling the overall operation of computing device 1000. The computing device 1000 can also include a user input device 1008 that allows a user of the computing device 1000 to interact with the computing device 1000. For example, the user input device 1008 can take a variety of forms, such as a button, keypad, dial, touch screen, audio input interface, visual/image capture input interface, input in the form of sensor data, etc. Still further, the computing device 1000 can include a display 1010 (screen display) that can be controlled by the processor 1002 to present visual information to the user. A data bus 1016 can facilitate data transfer between at least a storage device 1040, the processor 1002, and a controller 1013. The controller 1013 can be used to interface with and control different equipment through an equipment control bus 1014. The computing device 1000 can also include a network/bus interface 1011 that couples to a data link 1012. In the case of a wireless connection, the network/bus interface 1011 can include a wireless transceiver.

In some embodiments, the processor 1002 can be embodied in a variety of forms. For example, the processor 1002 can be embodied as various processing hardware-based means such as a microprocessor, a coprocessor, a controller or various other computing or processing devices including integrated circuits such as, for example, an application specific integrated circuit (ASIC), a field programmable gate array (FPGA), some combination thereof, or the like. Although illustrated as a single processor, it will be appreciated that the processor 1002 can include two or more processors. The processors can be in operative communication with each other and can be collectively configured to perform one or more functionalities of the computing device 1000 as described herein. In some embodiments, the processor 1002 can be configured to execute instructions that can be stored in the RAM 1020 or that can be otherwise accessible to the processor 1002.

The computing device 1000 also include a storage device 1040, which can comprise a single disk or a plurality of disks (e.g., hard drives), and includes a storage management module that manages one or more partitions within the storage device 1040. In some embodiments, storage device 1040 can include flash memory, semiconductor (solid state) memory or the like. The computing device 1000 can also include a Random-Access Memory (RAM) 1020 and a Read-Only Memory (ROM) 1022. The ROM 1022 can store programs, utilities or processes to be executed in a non-volatile manner. The RAM 1020 can provide volatile data storage, and stores instructions related to the operation of the computing device 1000.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for filtering an input signal according to a convolution kernel, the method comprising:
   receiving a set of filter coefficients associated with the convolution kernel;
   determining an order for a plurality of floating point operations configured to generate an element of an output signal, each floating point operation in the plurality of floating point operations corresponding to a particular filter coefficient in the set of filter coefficients, wherein the order for the plurality of floating point operations is determined based on a magnitude of the particular filter coefficient associated with each floating point operation; and
   filtering the input signal by the convolution kernel to generate an output signal, wherein the filtering comprises, for each discrete element of the output signal, executing, by a data path of a processing unit, the plurality of floating point operations according to the order.

2. The method of claim 1, wherein the order for the plurality of floating point operations is determined by sorting the floating point operations according to an ascending order of the magnitude of the particular filter coefficient associated with each floating point operation.

3. The method of claim 1, wherein the data path is a half-precision floating point data path.

4. The method of claim 3, wherein the processing unit comprises a central processing unit (CPU).

5. The method of claim 3, wherein the processing unit comprises a graphics processing unit (GPU), and wherein the order for the plurality of floating point operations is determined by a software driver for the GPU that is executed by a central processing unit (CPU) coupled to the GPU.

6. The method of claim 5, wherein an application executed by the CPU and configured to filter the input signal by the convolution kernel includes one or more instructions that comprise a call to an application programming interface (API) implemented by the software driver that causes the software driver to determine the order of floating point operations.

7. The method of claim 1, further comprising:
   converting elements of the input signal from a first data format to a half-precision floating point data format.

8. The method of claim 1, wherein each floating point operation comprises a fused multiply add (FMA) operation performed by:
   multiplying an element of the input signal with the particular filter coefficient to produce a partial product; and
   adding the partial product to a value in an accumulation register maintained by the data path.

9. The method of claim 1, wherein the convolution kernel is one-dimensional.

10. The method of claim 1, wherein the convolution kernel is two-dimensional.

11. The method of claim 10, wherein the input signal comprises an image, stored in a memory, that includes a two dimensional array of pixels, and wherein filtering the input signal is performed by applying the convolution kernel to different subsets of pixels across the image.

12. The method of claim 10, wherein the convolution kernel is separable such that filtering the input signal comprises:
  applying a first set of filter coefficients to rows of elements in the input signal in a first pass to generate an intermediate filtered signal; and
  applying a second set of filter coefficients to columns of elements in the intermediate filtered signal in a second pass to generate the output signal.

13. A computing device configured to filter an input signal according to a convolution kernel, the computing device comprising:
  a memory storing the input signal and a set of filter coefficients associated with the convolution kernel; and
  a processor coupled to the memory and configured to:
    read the set of filter coefficients from the memory;
    determine an order for a plurality of floating point operations by sorting the set of filter coefficients in an ascending order based on a magnitude of each filter coefficient in the set of filter coefficients; and
    for each of the plurality of floating point operations in accordance with the order, issue an instruction to a half-precision floating point data path.

14. The computing device of claim 13, wherein the convolution kernel is two-dimensional.

15. The computing device of claim 14, wherein the processor is a system-on-chip (SoC) that includes at least one central processing unit (CPU) core and one or more graphics processing unit (GPU) cores.

16. The computing device of claim 15, wherein the half-precision floating point data path is included in a GPU core in the one or more GPU cores.

17. The computing device of claim 13, further comprising, at least one of:
  converting a data format of elements of the input signal from a first data format to a half-precision floating point format; or
  converting a data format of elements of a filtered output signal from a half-precision floating point format to a second data format, wherein each element of the filtered output signal is generated in response to the execution of the plurality of floating point operations on a portion of the input signal.

18. A non-transitory computer readable medium storing instructions that, when executed by a processor, cause the processor to filter an input signal according to a convolution kernel by performing steps comprising:
  reading an input signal from a memory;
  reading a set of filter coefficients associated with the convolution kernel from the memory;
  sorting the set of filter coefficients based on a magnitude of each filter coefficient; and
  filtering the input signal by issuing a plurality of floating point operations to a half-precision floating point data path, wherein the plurality of floating point operations are issued according to an ascending order of magnitudes in the sorted set of filter coefficients.

19. The non-transitory computer readable medium of claim 18, the steps further comprising converting a data format of elements of the input signal from a first data format to a half-precision floating point format.

20. The non-transitory computer readable medium of claim 18, the steps further comprising storing a filtered output signal in the memory.

* * * * *